US 8,564,015 B2

(12) United States Patent
Jou et al.

(10) Patent No.: US 8,564,015 B2
(45) Date of Patent: *Oct. 22, 2013

(54) ORGANIC LIGHT-EMITTING DIODE WITH HIGH COLOR RENDERING

(75) Inventors: Jwo-Huei Jou, Hsinchu (TW); Yi-Chieh Chou, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 286 days.

This patent is subject to a terminal disclaimer.

(21) Appl. No.: 12/903,635

(22) Filed: Oct. 13, 2010

(65) Prior Publication Data

US 2011/0303902 A1    Dec. 15, 2011

Related U.S. Application Data

(63) Continuation-in-part of application No. 12/797,329, filed on Jun. 9, 2010.

(30) Foreign Application Priority Data

Jul. 15, 2010   (TW) ................................ 99123253 A

(51) Int. Cl.
    *H01L 51/00* (2006.01)
(52) U.S. Cl.
    USPC ....................... 257/103; 257/40; 257/E51.022
(58) Field of Classification Search
    USPC .......................................................... 257/40
    See application file for complete search history.

(56) References Cited

U.S. PATENT DOCUMENTS

| | | | |
|---|---|---|---|
| 7,919,783 B2 * | 4/2011 | Ushikubo et al. | 257/89 |
| 8,026,662 B2 * | 9/2011 | Ishihara et al. | 313/504 |
| 8,067,885 B2 * | 11/2011 | Kashiwabara | 313/504 |
| 2003/0189401 A1 * | 10/2003 | Kido et al. | 313/504 |
| 2004/0227460 A1 * | 11/2004 | Liao et al. | 313/506 |
| 2005/0134174 A1 * | 6/2005 | Shiratori et al. | 313/506 |
| 2007/0129545 A1 * | 6/2007 | Inoue et al. | 544/225 |
| 2007/0241667 A1 * | 10/2007 | Ohsawa et al. | 313/504 |
| 2009/0261360 A1 * | 10/2009 | Yasukawa et al. | 257/89 |

FOREIGN PATENT DOCUMENTS

| | | |
|---|---|---|
| CN | 101055923 (A) | 10/2007 |
| CN | 101611505 (A) | 12/2009 |

* cited by examiner

*Primary Examiner* — Benjamin Sandvik
(74) *Attorney, Agent, or Firm* — Muncy, Geissler, Olds & Lowe, PLLC

(57) ABSTRACT

An organic light-emitting diode with high color rendering is provided, which includes: a substrate; a first electrode disposed over the substrate; a light-emitting region disposed over the first electrode, in which the light-emitting region includes a plurality of light-emitting layers and at least one spacer, the spacer being disposed between any two of the light-emitting layers and each of the light-emitting layers individually including a dye; and a second electrode disposed over the light-emitting region. Accordingly, the organic light-emitting diode according to the present invention can exhibit high color rendering and high illumination efficiency.

13 Claims, 6 Drawing Sheets

ORGANIC LIGHT-EMITTING DIODE WITH HIGH COLOR RENDERING

CROSS REFERENCE TO RELATED APPLICATIONS

This application is a continuation-in-part (CIP) of U.S. patent application for "Organic light-emitting diode with high color rendering", U.S. application Ser. No. 12/797,329, filed Jun. 9, 2010.

BACKGROUND OF THE INVENTION

1. Field of the Invention

The present invention relates to an organic light-emitting diode and, more particularly, to an organic light-emitting diode with high color rendering.

2. Description of Related Art

Organic light-emitting diodes (OLEDs) are advantageous in having low weight, thinness (less than 1 mm), high brightness, wide viewing angle, no need for backlight, low energy consumption, short response time, high resolution, low heat emission, shock resistance, low producing cost, good flexibility etc., and therefore have drawn much attention to the research in the related fields.

Reference with FIG. 1, wherein an organic light-emitting diode is shown, which comprises: a substrate 11, an anode 12, a hole injection layer 13, a hole transport layer 14, a light-emitting layer 15, an electron transport layer 16, an electron injection layer 17 and a cathode 18, in which the light-emitting layer 15 is disposed between the hole transport layer 14 and the electron transport layer 16, and the light-emitting layer 15 is mainly used to control the combination of the electrons and the holes as well as the light-emission.

The color rendering index (CRI) or the power or current efficiency of the OLEDs can be improved with the use of the multiple organic layers and emission layers, however it is difficult to improve the color rendering index (CRI) and the power or current efficiency simultaneously in the conventional OLEDs, whereas the multiple organic layers and emission layers may result in complex process steps that may trigger high providing cost. Thus, it is still difficult to develop an OLED having excellent color rendering index and power or current efficiency at the same time, which is able to replace the commonplace fluorescent lamp.

Therefore, it is desirable to provide an improved OLED that can be applied to illumination usage, which has high illumination efficiency and excellent color rendering index (CRI) simultaneously and is able to replace the commonplace fluorescent lamp.

SUMMARY OF THE INVENTION

The object of the present invention is to provide an organic light-emitting diode (OLED), which has a spacer and therefore can have excellent color rendering index (CRI) and high power or current efficiency simultaneously.

To achieve the object, the organic light-emitting diode (OLED) of the present invention includes: a substrate; a first electrode disposed over the substrate; a light-emitting region disposed over the first electrode, in which the light-emitting region includes a plurality of light-emitting layers and at least one spacer, the spacer being disposed between any two of the light-emitting layers and each of the light-emitting layers individually including a dye; and a second electrode disposed over the light-emitting region. Herein, the first electrode and the second electrode can function as an anode and a cathode of the organic light-emitting diode, respectively. The materials of the first electrode and the second electrode are not particularly limited and may be any conventional anode material (such as indium tin oxide) and cathode material (such as LiF/Al).

The OLED of the present invention utilizes at least one spacer disposed between any two of the light-emitting layers and therefore can obtain ideal power or current efficiency and excellent color rendering index (CRI). Even if the OLED of the present invention has merely two light-emitting layers, the OLED of the present invention still exhibits excellent color rendering index (CRI) and high power or current efficiency due to a spacer disposed between the two light-emitting layers (i.e. the light-emitting region being designed in a three-layered structure). Compared with a conventional OLED having multi-organic layers and light-emitting layers, the OLED of the present invention has an uncomplicated structure and can be easily produced with simple processing.

According to the OLED of the present invention, preferably, each spacer cannot emit light, and its material may be an organic material and selected depending on the energy level (HOMO and LUMO) of the material. For example, the HOMO and LUMO energy levels of the spacer material locate between those of the adjacent light-emitting layers, and therefore the combination of the holes and the electrons of the organic light-emitting layers can be well controlled to emit light and further to obtain excellent color rendering index (CRI). According to the present invention, the material of the spacer preferably has a hole mobility of $2\times10^{-3}$ to $6\times10^{-8}$ $cm^2V^{-1}S^{-1}$. Under an electric field of $3.6\times10^{-5}$ $Vcm^{-1}$, the electron mobility of the material of the spacer is preferably $2\times10^{-3}$ to $6\times10^{-8}$ $cm^2V^{-1}S^{-1}$.

According to the OLED of the present invention, each spacer may be the same or different in material, and may use a host material, a fluorescent dye or a mixture thereof. Preferably, TCTA, CBP, 4P-NPD, TPBi, $Alq_3$ or a mixture thereof is used.

The OLED of the present invention may optionally further include a hole transport layer, a hole injection layer, an electron transport layer, or an electron injection layer. If a hole transport layer or a hole injection layer is further included in the OLED of the present invention, the included hole transport layer or hole injection layer may be located between the first electrode and the light-emitting region. If both a hole transport layer and a hole injection layer are included in the OLED, the hole injection layer and the hole transport layer are sequentially formed on the first electrode to locate the hole injection layer between the first electrode and the hole transport layer, and to locate the hole transport layer between the first electrode and the first light-emitting region. If an electron transport layer or an electron injection layer is further included in the OLED of the present invention, the included electron transport layer or electron injection layer may be located between the second light-emitting region and the second electrode. If both an electron transport layer and an electron injection layer are included in the OLED, the electron transport layer and the electron injection layer are sequentially formed on the light-emitting region to locate the electron transport layer between the light-emitting region and the electron injection layer, and to locate the electron injection layer between the electron transport layer and the second electrode.

According to the OLED of the present invention, the dye in each light-emitting layer may independently be a fluorescent dye, a phosphorescence dye or a mixture thereof. If the dye in the light-emitting layer is a phosphorescence dye or a mixture of a fluorescent dye and a phosphorescence dye, the light-emitting layer preferably further include a host material. If the dye in the light-emitting layer is a fluorescent dye, the light-emitting layer may optionally include a host material. Herein, the light-emitting layer of the present invention may use any conventional fluorescent dye or phosphorescence dye. For example, organic light-emitting materials for green light emission including, but being not limited to, Ir(ppy)$_3$, BNE, Alq, DPT, Alq3, Bebq$_2$, DMQA, Coumarin 6, Q, NMQ and Quinacrine etc; organic light-emitting materials for red light emission including, but being not limited to, Ir(piq)$_2$(acac), DCM-2, TMS-SiPc, DCJTB and ABTX etc; organic light-emitting materials for blue light emission including, but being not limited to, MDP3FL, DSB, TPAN, DPAN, DPAP, Perylene (C$_{20}$H$_{12}$), DPVBi, PPD, α-NPD2, β-NPD, TTBND, DCTA, and TDAPTz etc; and organic light-emitting materials for orange light emission including, but being not limited to, Ir(2-phq)$_3$ may be used.

According to the OLED of the present invention, the light-emitting region may include two to four light-emitting layers and is not particularly limited. Specially, the light-emitting layers may include a first light-emitting layer and a second light-emitting layer, in which the first light-emitting layer and the second light-emitting layer may be two adjacent light-emitting layers, therewith the space being disposed between the first light-emitting layer and the second light-emitting layer and the first light-emitting being disposed between the second light-emitting layer and the first electrode. Alternatively, the light-emitting layers may include a first light-emitting layer, a second light-emitting layer and a third light-emitting layer, in which the first light-emitting layer may be adjacent to the second light-emitting layer and the second light-emitting layer may be adjacent to the third light-emitting layer, therewith the spacer(s) being disposed between the first light-emitting layer and the second light-emitting layer, or between the second light-emitting layer and the third light-emitting layer, or between the first light-emitting layer and the second light-emitting layer and between the second light-emitting layer and the third light-emitting layer, the first light-emitting layer being disposed between the second light-emitting layer and the first electrode, and the second light-emitting layer being disposed between the first light-emitting layer and the third light-emitting layer.

According to the OLED of the present invention, each light-emitting layer may be the same or different in material, including dye materials and host materials. For example, the first light-emitting layer, the second light-emitting layer and the third light-emitting layer may use the same or different materials. Preferably, MDP3FL and DSB are included in the first light-emitting layer as dyes, in which the amount of DSB may range from 0.01 to 50 wt % of the MDP3FL; CBP, Ir(piq)$_2$(acac), Ir(2-phq)$_3$ and Ir(ppy)$_3$ are included in the second light-emitting layer and the third light-emitting layer as a host material and dyes, respectively, in which a content of the Ir(piq)$_2$(acac) may range from 0.01 to 10 wt % of the host material, a content of the Ir(2-phq)$_3$ may range from 0.01 to 10 wt % of the host material, and a content of the Ir(ppy)$_3$ may range from 0.01 to 10 wt % of the host material.

According to the OLED of the present invention, the materials of the hole injection layer and the electron injection layer are not specially limited, and may be any conventional hole injection material and electron injection material, respectively. Additionally, the hole transport layer is not specially limited in material, and any conventional hole transport material may be used. Preferably, an aromatic tertiary amine having at least one carbon-bonded trivalence nitrogen and at least one aromatic ring is used. The aromatic tertiary amine can be an arylamine such as a monarylamine, a diarylamine or a triarylamine. Also, the material of the electron transport layer is not specially limited and may be any conventional electron transport material. Preferably, an oxinoid compound chelated with metal or an oxine chelates such as Alq$_3$ is used.

According to the OLED of the present invention, the substrate is not specially limited and may be any conventional substrate, such as a silicon-based substrate, a glass substrate, a quartz substrate or a plastic substrate.

The OLED of the present invention may be a bottom-emission-typed OLED or a top-emission-typed OLED. If the present invention applies a bottom-emission-typed OLED, preferably, the substrate is a transparent substrate, the first electrode is a transparent conductive layer, and the second electrode is an opaque conductive layer. If the present invention applies a top-emission-typed OLED, preferably, the substrate is an opaque substrate, the first electrode is an opaque conductive layer, and the second electrode is a transparent conductive layer.

DETAILED DESCRIPTION OF THE PREFERRED EMBODIMENT

Hereinafter, the present invention will be described in further detail with reference to examples and comparative examples. It is to be understood, however, that these examples are illustrative only and the scope of the present invention is not limited thereto. The specific examples below are to be construed as merely illustrative, and not limitative of the remainder of the disclosure in any way whatsoever. Without further elaboration, it is believed that one skilled in the art can, based on the description herein, utilize the present invention to its fullest extent. All publications cited herein are hereby incorporated by reference in their entirety.

Figure 1:
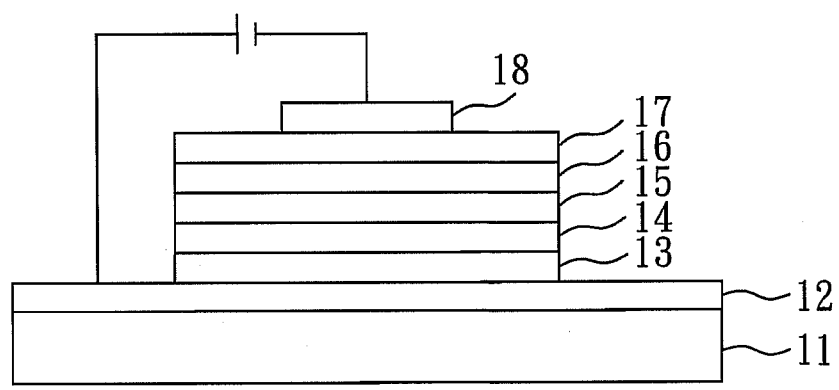
FIG. 1 is a schematic view of a conventional OLED.
Figure 2:
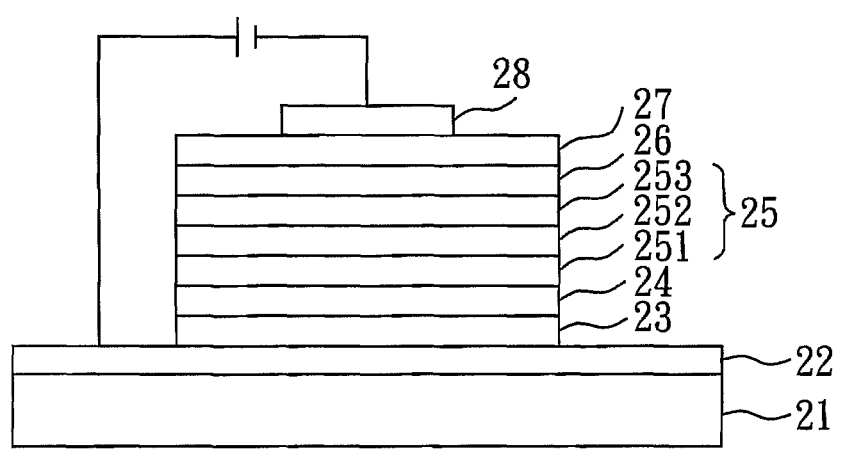
FIG. 2 is a schematic view of an OLED according to a preferred example of the present invention.

FIG. 2 is a schematic view of an OLED according to a preferred example of the present invention. The preferred example of the preparation of the OLED in the present invention is detailed illustrated below with reference to the FIG. 2.

Example 1

First, a substrate 21 is provided with a first electrode 22 formed thereon. In the present example, the substrate 21 is a glass substrate and the first electrode 22 is an ITO anode of 125 nm in thickness.

Then, a PEDOT:PSS polymer is coated on the first electrode 22 by spin coating to form a hole injection layer 23. After that, TAPC small molecules are vacuum evaporated to form a hole transport layer 24 on the hole injection layer 23. In the present example, the hole transport layer 24 has a thickness of 10 nm.

MDP3FL as a deep blue dye and DSB as an azure dye are mixed in THF, followed by vacuum drying to provide an evaporating source, which is then used to form a first light-emitting layer 251 on the hole transport layer 24. In the present example, the concentration of the DSB is 3 wt % of the MDP3FL, and the first light-emitting layer 251 has a thickness of 10 nm.

Then, a spacer 252 is formed on the first light-emitting layer 251. In the present example, the spacer 252 has a thickness of 3 nm, and the spacer 252 is made of CBP.

$Ir(piq)_2(acac)$ as a red dye, $Ir(2-phq)_3$ as an orange-red dye, $Ir(ppy)_3$ as a green dye, and CBP as a host material are mixed in THF, followed by vacuum drying to provide an evaporating source, which is then used to form a second light-emitting layer 253 on the spacer 252. In the present example, the concentration of the $Ir(piq)_2(acac)$ is 1 wt % of CBP, the concentration of the $Ir(2-phq)_3$ is 1 wt % of CBP, the concentration of the $Ir(ppy)_3$ is 3 wt % of CBP, and the second light-emitting layer 253 has a thickness of 3 nm.

Accordingly, the entire assembly of the first light-emitting layer 251, the spacer 252 and the second light-emitting layer 253 functions as the light-emitting region 25 of the OLED according to the present example.

Then, by vacuum evaporating, Bphen is evaporated on the second light-emitting layer 253 to form an electron transport layer 26 of 15 nm in thickness. Subsequently, $Alq_3$ is evaporated on the electron transport layer 26 to form an electron injection layer 27 of 5 nm in thickness.

Finally, a second electrode 28 is formed on the electron injection layer 27, in which the second electrode 28 is a LiF/Al electrode.

Accordingly, an OLED of the present example is completed, including: a substrate 21; a first electrode 22 disposed over the substrate 21; a light-emitting region 25 disposed over the first electrode 22, in which the light-emitting region 25 includes a plurality of light-emitting layers (i.e. the first light-emitting layer 251 and the second light-emitting layer 253) and at least one spacer 252, therewith the spacer 252 being disposed between the first light-emitting layer 251 and the second light-emitting layer 253, the first light-emitting layer 251 being disposed between the second light-emitting layer 253 and the first electrode 22, and each of the light-emitting layers 251 and 253 individually including a dye; and a second electrode 28 disposed over the light-emitting region 25. Herein, MDP3FL as a deep blue dye and DSB as an azure dye are included in the first light-emitting layer 251, and CBP as a host material, $Ir(piq)_2(acac)$ as a red dye, $Ir(2-phq)_3$ as an orange-red dye, $Ir(ppy)_3$ as a green dye are included in the second light-emitting layer 253.

Meanwhile, the OLED of the present example further includes: a hole injection layer 23 and a hole transport layer 24 disposed on the first electrode 22 in sequence and disposed between the first electrode 22 and the light-emitting region 25; and an electron transport layer 26 and an electron injection layer 27 disposed on the light-emitting region 25 in sequence and disposed between the light-emitting region 25 and the second electrode 28.

The OLED provided by the present example is tested by a 3.3V driving voltage test and can emit white light. With brightness of 100 $cd/m^2$, the luminescent efficiency is 4.9 lm/W; whereas with brightness of 1000 $cd/m^2$, the luminescent efficiency is 2.2 lm/W. Meanwhile, the obtained white light from the OLED of the present example has a CIE coordinate of (0.35, 0.38) and has a CRI value of 92.

Example 2

The OLED of the present example is provided by the same method as described in the Example 1, except that the spacer in the present example is made of TCTA.

The OLED provided by the present example is tested by a 3.5V driving voltage test and can emit white light. With brightness of 100 $cd/m^2$, the luminescent efficiency is 12.5 lm/W; whereas with brightness of 1000 $cd/m^2$, the luminescent efficiency is 7.5 lm/W. Meanwhile, the obtained white light from the OLED of the present example has a CIE coordinate of (0.43, 0.44) and has a CRI value of 94.

Example 3

Figure 3:
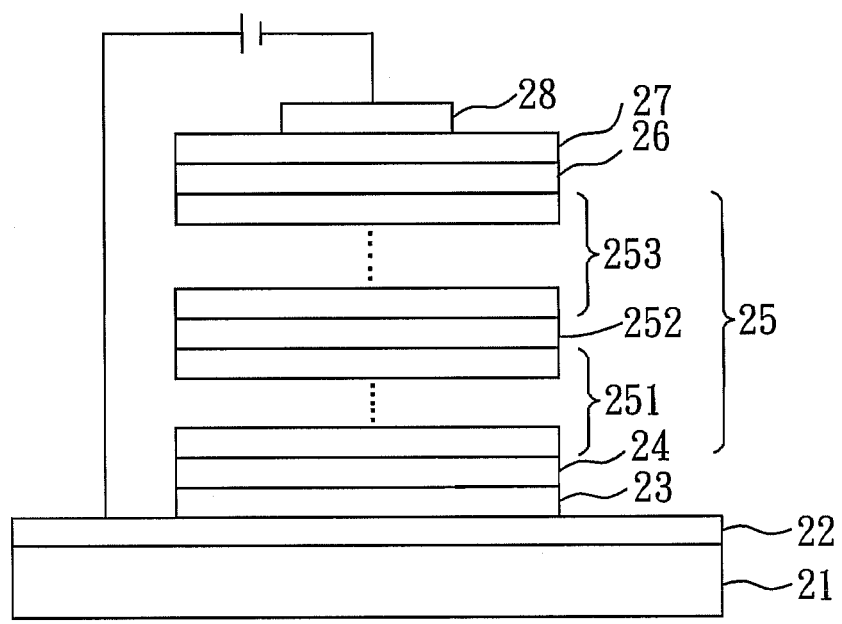
FIG. 3 is a schematic view of an OLED according to another preferred example of the present invention.

The OLED and the method for fabricating the same according to the present example are the same as those described in the Example 1, except that, as shown in FIG. 3, the light-emitting region 25 includes a plurality of first light-emitting layers 251, a spacer 252 and a plurality of second light-emitting layers 253 in sequence. Herein, each first light-emitting layer 251 is the same in material and each second light-emitting layer 253 is the same in material.

Example 4

Figure 4:
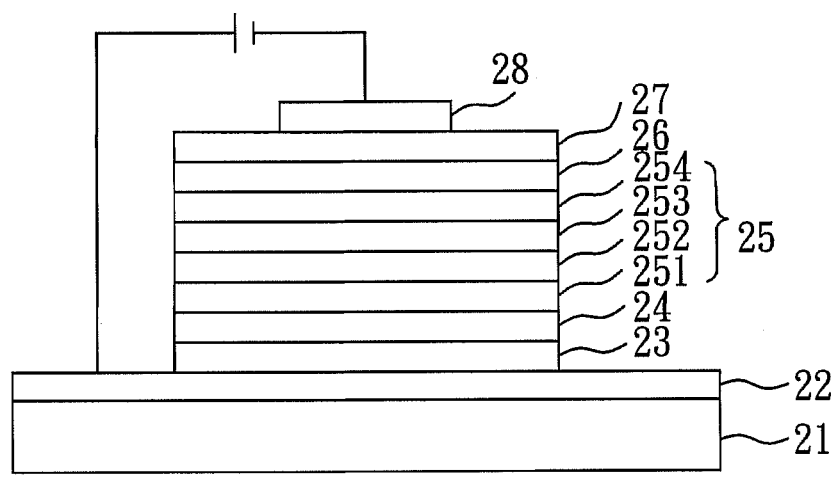
FIG. 4 is a schematic view of an OLED according to another preferred example of the present invention.

The OLED and the method for fabricating the same according to the present example are the same as those described in the Example 1, except that, as shown in FIG. 4, the light-emitting region 25 includes a first light-emitting layer 251, a spacer 252, a second light-emitting layer 253 and a third light-emitting layer 254 in sequence. Herein, the third light-emitting layer 254 is the same as the second light-emitting layer 253 in material.

Example 5

Figure 5:
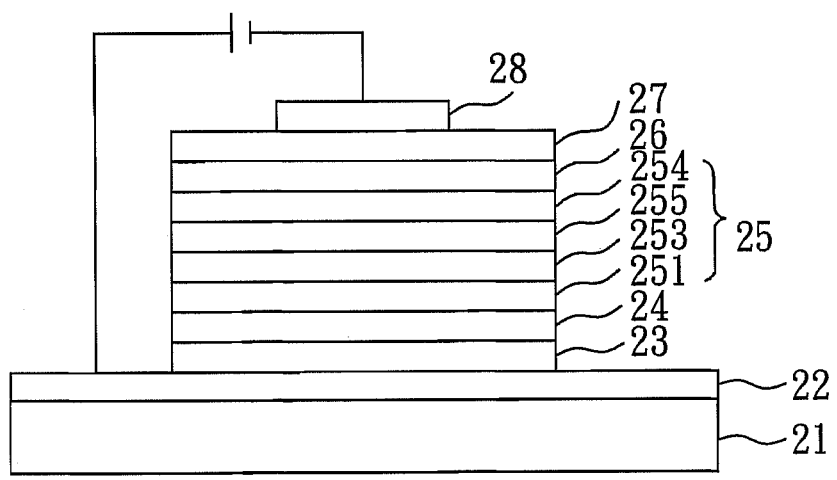
FIG. 5 is a schematic view of an OLED according to another preferred example of the present invention.

The OLED and the method for fabricating the same according to the present example are the same as those described in the Example 1, except that, as shown in FIG. 5, the light-emitting region 25 includes a first light-emitting layer 251, a second light-emitting layer 253, a spacer 255 and a third light-emitting layer 254 in sequence. Herein, the third light-emitting layer 254 is the same as the second light-emitting layer 253 in material, and the spacer 255 is made of CBP.

Example 6

Figure 6:
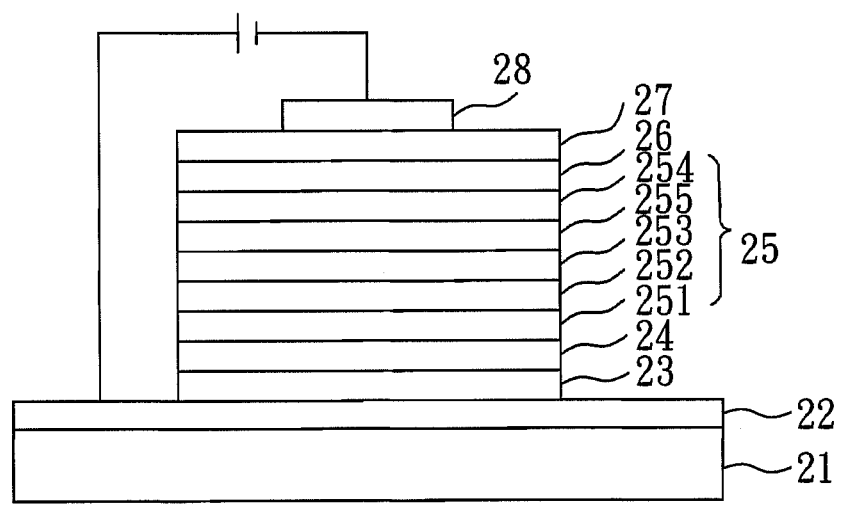
FIG. 6 is a schematic view of an OLED according to another preferred example of the present invention.

The OLED and the method for fabricating the same according to the present example are the same as those described in the Example 1, except that, as shown in FIG. 6, the light-emitting region 25 includes a first light-emitting layer 251, a spacer 252, a second light-emitting layer 253, a spacer 255 and a third light-emitting layer 254 in sequence. Herein, the third light-emitting layer 254 is the same as the second light-emitting layer 253 in material, and the spacer 255 is made of TCTA.

Accordingly, the OLED of the present invention utilizes at least one spacer disposed between any two light-emitting layers, in which the energy level of the spacer can be adjusted and located between the energy levels of the two adjacent light-emitting layers, and therefore can obtain ideal power or current efficiency and excellent color rendering index (CRI) with an uncomplicated structure that can be provided by simple processing steps. Additionally, since the OLED of the present invention has the uncomplicated structure and can be easily produced with simple processing and can provide white light with excellent color rendering index (CRI), the OLED of the present invention is able to act for lighting usage to replace the commonly-used fluorescent lamp.

Although the present invention has been explained in relation to its preferred embodiment, it is to be understood that many other possible modifications and variations can be made without departing from the scope of the invention as hereinafter claimed.

What is claimed is:

1. An organic light-emitting diode, comprising:
a substrate;
a first electrode disposed over the substrate;
a light-emitting region disposed over the first electrode, in which the light-emitting region comprises a first light-emitting layer, a second light-emitting layer and at least one spacer, therewith the at least one spacer being disposed between the first light-emitting layer and the second light-emitting layer, the first light-emitting layer being disposed between the second light-emitting layer and the first electrode, each of the first light-emitting layer and the second light-emitting layer individually including a dye, and highest occupied molecular orbital (HOMO) and lowest unoccupied molecular orbital (LUMO) energy levels of a material of the spacer being located between those of adjacent light-emitting layers, wherein the first light-emitting layer comprises MDP3FL and DSB as the dye therewith a content of the DSB being from 0.01 wt % to 50 wt % of the MDP3FL; and
a second electrode disposed over the light-emitting region.

2. The organic light-emitting diode as claimed in claim 1, wherein the material of the at least one spacer is a host material, a fluorescent dye or a mixture thereof.

3. The organic light-emitting diode as claimed in claim 1, wherein the material of the at least one spacer is TCTA, CBP, 4P-NPD, TPBi, $Alq_3$, or a mixture thereof.

4. The organic light-emitting diode as claimed in claim 1, wherein the dye is a fluorescent dye, a phosphorescence dye, or a mixture thereof.

5. The organic light-emitting diode as claimed in claim 4, wherein at least one of the light-emitting layers comprises the phosphorescence dye and a host material.

6. The organic light-emitting diode as claimed in claim 1, wherein the second light-emitting layer comprises $Ir(piq)_2$(acac), $Ir(2-phq)_3$ and $Ir(ppy)_3$ as the dye and further comprises a host material, therewith the content of the $Ir(piq)_2$(acac) being from 0.01 wt % to 10 wt % of the host material, the content of the $Ir(2-phq)_3$ being from 0.01 wt % to 10 Wt % of the host material, and a content of the $Ir(ppy)_3$ being from 0.01 wt % to 10 wt % of the host material.

7. The organic light-emitting diode as claimed in claim 1, wherein the light-emitting layers further comprise a third light-emitting layer, therewith the first light-emitting layer being disposed between the second light-emitting layer and the first electrode, the second light-emitting layer being disposed between the first light-emitting layer and the third light-emitting layer, and the at least one spacer being disposed between the first light-emitting layer and the second light-emitting layer, or between the second light-emitting layer and the third light-emitting layer, or between the first light-emitting layer and the second light-emitting layer and between the second light-emitting layer and the third light-emitting layer.

8. The organic light-emitting diode as claimed in claim 7, wherein the second light-emitting layer comprises $Ir(piq)_2$(acac), $Ir(2-phq)_3$ and $Ir(ppy)_3$ as the dye and further comprises a host material, therewith the content of the $Ir(piq)_2$(acac) being from 0.01 wt % to 10 wt % of the host material, the content of the $Ir(2-phq)_3$ being from 0.01 wt % to 10 wt % of the host material, and a content of the $Ir(ppy)_3$ being from 0.01 wt % to 10 wt % of the host material.

9. The organic light-emitting diode as claimed in claim 7, wherein the third light-emitting layer comprises $Ir(piq)_2$(acac), $Ir(2-phq)_3$ and $Ir(ppy)_3$ as the dye and further comprises a host material, therewith the content of the $Ir(piq)_2$(acac) being from 0.01 wt % to 10 wt % of the host material, the content of the $Ir(2-phq)_3$ being from 0.01 wt % to 10 wt % of the host material, and a content of the $Ir(ppy)_3$ being from 0.01 wt % to 10 wt % of the host material.

10. The organic light-emitting diode as claimed in claim 1, further comprising: a hole transport layer disposed between the first electrode and the light-emitting region; a hole injection layer disposed between the first electrode and the light-emitting region; or a hole injection layer and a hole transport layer disposed sequentially on the first electrode and between the first electrode and the light-emitting region.

11. The organic light-emitting diode as claimed in claim 1, further comprising: an electron transport layer disposed between the light-emitting region and the second electrode; an electron injection layer disposed between the light-emitting region and the second electrode; or an electron transport layer and an electron injection layer disposed sequentially on the light-emitting region and between the light-emitting region and the second electrode.

12. The organic light-emitting diode as claimed in claim 1, wherein the spacer is made of a material with a hole mobility of $2\times10^{-3}$ to $6\times10^{-8}$ $cm^2V^{-1}S^{-1}$.

13. The organic light-emitting diode as claimed in claim 1, wherein the spacer is made of a material with an electron mobility of the material of the spacer is $2\times10^{-3}$ to $6\times10^{-8}$ $cm^2V^{-1}S^{-1}$ under an electric field of $3.6\times10^{-5}$ $Vcm^{-1}$.

* * * * *